(12) United States Patent
Pan

(10) Patent No.: US 7,994,573 B2
(45) Date of Patent: Aug. 9, 2011

(54) STRUCTURE AND METHOD FOR FORMING POWER DEVICES WITH CARBON-CONTAINING REGION

(75) Inventor: James Pan, West Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/334,393

(22) Filed: Dec. 12, 2008

(65) Prior Publication Data

US 2009/0302381 A1 Dec. 10, 2009

Related U.S. Application Data

(60) Provisional application No. 61/013,953, filed on Dec. 14, 2007.

(51) Int. Cl.
*H01L 29/66* (2006.01)

(52) U.S. Cl. ......... 257/332; 257/328; 257/E21.46; 257/E21.41; 257/E29.262; 257/E49.002; 438/151; 438/270; 438/587

(58) Field of Classification Search .......... 438/151, 438/587, 758; 257/328, 490, 332, E21.41, 257/E21.46, E29.252, E49.002
See application file for complete search history.

(56) References Cited

U.S. PATENT DOCUMENTS

| | | | |
|---|---|---|---|
| 5,318,915 A * | 6/1994 | Baliga et al. ............ | 438/520 |
| 5,950,076 A | 9/1999 | Baliga | |
| 6,153,920 A * | 11/2000 | Gossmann et al. ........ | 257/607 |
| 6,198,157 B1 | 3/2001 | Ishida et al. | |
| 6,476,429 B2 | 11/2002 | Baba | |
| 6,635,950 B1 | 10/2003 | Ishida et al. | |
| 6,781,156 B2 | 8/2004 | Drobnis et al. | |
| 6,784,488 B2 | 8/2004 | Huang et al. | |
| 7,345,342 B2 | 3/2008 | Challa et al. | |
| 2004/0119076 A1 | 6/2004 | Ryu | |
| 2006/0183339 A1 * | 8/2006 | Ravi et al. ............ | 438/758 |
| 2006/0214222 A1 | 9/2006 | Challa et al. | |
| 2006/0220140 A1 | 10/2006 | Robb et al. | |
| 2006/0240625 A1 * | 10/2006 | Loechelt et al. ........ | 438/268 |
| 2008/0131619 A1 * | 6/2008 | Cho et al. ............ | 427/525 |
| 2008/0211012 A1 * | 9/2008 | Kocon et al. .......... | 257/328 |

FOREIGN PATENT DOCUMENTS

JP 09-270513 A 10/1997

(Continued)

OTHER PUBLICATIONS

PCT International Search Report of the International Searching Authority for Application No. PCT/US2008/86841, Mailed Feb. 13, 2009, 2 pages.

(Continued)

*Primary Examiner* — William M Brewster
*Assistant Examiner* — Wilner Jean Baptiste
(74) *Attorney, Agent, or Firm* — Kilpatrick Townsend & Stockton LLP

(57) ABSTRACT

A field effect transistor (FET) includes body regions of a first conductivity type over a semiconductor region of a second conductivity type. The body regions form p-n junctions with the semiconductor region. Source regions of the second conductivity type extend over the body regions. The source regions form p-n junctions with the body regions. Gate electrodes extend adjacent to but are insulated from the body regions by a gate dielectric. A carbon-containing region extends in the semiconductor region below the body regions.

13 Claims, 7 Drawing Sheets

| | FOREIGN PATENT DOCUMENTS | | | KR | 20060022926 A | 3/2006 |
|---|---|---|---|---|---|---|
| JP | 10/242153 | A | 9/1998 | KR | 100822035 B1 | 4/2008 |
| JP | 11/260752 | A | 2/1999 | | | |
| JP | 2001/298189 | A | 10/2001 | | | |
| JP | 2005/510061 | T | 4/2005 | | | |
| JP | 2005/513783 | T | 5/2005 | | | |
| KR | 1998-071448 | A | 10/1998 | | | |
| KR | 10-2001-0098551 | A | 11/2001 | | | |
| KR | 10-2004-0065224 | A | 7/2004 | | | |

OTHER PUBLICATIONS

PCT International Written Opinion of the International Searching Authority for Application No. PCT/US2008/86841, Mailed Feb. 13, 2009, 5 pages.

* cited by examiner

STRUCTURE AND METHOD FOR FORMING POWER DEVICES WITH CARBON-CONTAINING REGION

CROSS-REFERENCES TO RELATED APPLICATIONS

This application claims the benefit of U.S. Provisional Application No. 61/013,953, filed Dec. 14, 2007, which is incorporated herein by reference in its entirety for all purposes.

BACKGROUND OF THE INVENTION

The present invention relates in general to semiconductor technology and more particularly to semiconductor power devices with carbon-doped region and method of forming the same.

Generally, an n-channel trench-gate power MOSFET includes an n-type substrate on which an n-type epitaxial layer is formed. The substrate embodies the drain of the MOSFET. A p-type body region extends into the epitaxial layer. Trenches extend through the body region and into the portion of the epitaxial layer bounded by the body region and the substrate (commonly referred to as the drift region). A gate dielectric layer is formed on the sidewalls and bottom of each trench. Source regions flank the trenches. Heavy body regions are formed within the body region between adjacent source regions. Gate electrodes (e.g., from polysilicon) fill the trenches and embody the gate of the MOSFET. A dielectric cap covers the trenches and also partially extends over the source regions. A top-side metal layer electrically contacts the source regions and the heavy body regions. A bottom-side metal layer contacts the substrate In such conventional power devices, obtaining a higher breakdown voltage often comes at the expense of higher on-resistance (Rdson). Thus, there is a need for techniques that improve breakdown voltage of power devices without adversely impacting other device characteristics.

BRIEF SUMMARY OF THE INVENTION

In accordance with an embodiment of the invention, a field effect transistor (FET) includes body regions of a first conductivity type over a semiconductor region of a second conductivity type. The body regions form p-n junctions with the semiconductor region. Source regions of the second conductivity type extend over the body regions. The source regions form p-n junctions with the body regions. Gate electrodes extend adjacent to but are insulated from the body regions by a gate dielectric. A carbon-containing region extends in the semiconductor region below the body regions.

In one embodiment, the semiconductor region further includes a substrate over which the carbon-containing region extends, and a drift region of the second conductivity type that extends between the carbon-containing region and the body regions. The substrate has a doping concentration greater than that of the drift region.

In another embodiment, the carbon-containing region is in direct contact with the substrate and is spaced from the body regions.

In another embodiment, each gate electrode is disposed in a trench extending adjacent the body regions and terminating within the semiconductor region.

In another embodiment, each trench further includes a shield electrode disposed below the gate electrode. The gate and shield electrodes are insulated from one another by an inter-electrode dielectric layer.

In another embodiment, each trench includes a thick bottom dielectric extending along the bottom of the trench below the gate electrode.

In another embodiment, the gate electrodes extend laterally over the semiconductor and body regions and overlap the source regions.

In another embodiment, the entirety of carbon-containing region extends below the trenches.

In another embodiment, the carbon-containing region abuts sidewalls of the trenches.

In another embodiment, the carbon-containing region is of the second conductivity type.

In accordance with an embodiment of the invention, a method of forming a field effect transistor (FET) includes forming a carbon-containing region over a substrate. An epitaxial layer is formed over the carbon-containing region. The epitaxial layer has a lower doping concentration than the substrate. A body region of a first conductivity type is formed in the epitaxial layer. The epitaxial layer is of a second conductivity type and forms a p-n junction with the body region. Gate electrodes are formed adjacent to but insulated from the body regions. Source regions of the second conductivity type are formed in the body regions. The source regions form p-n junctions with the body regions.

In one embodiment, the carbon-containing region is formed epitaxially.

In another embodiment, the carbon-containing region is in direct contact with the substrate.

In another embodiment, the carbon-containing region is of the second conductivity type.

In another embodiment, trenches extending into semiconductor regions are formed. The trenches house the gate electrodes.

In another embodiment, the entirety of carbon-containing region extends below the trenches.

In another embodiment, the trenches extend into the carbon-containing region.

DETAILED DESCRIPTION OF THE INVENTION

According to the embodiments of the present invention, techniques directed to integrated circuits and their processing are disclosed. More particularly, the invention provides methods and devices for power field effect transistors (FETs) which include a carbon-containing layer. The carbon-containing layer is configured to provide a higher breakdown voltage and other advantageous features described more fully below. Merely by way of example, the invention has been described in the context of trench power MOSFETs, but it would be recognized that the invention has a much broader range of applicability. For example, the invention can be applied to planar power MOSFETs as well as to trench gate and planar gate IGBTs.

Depending on the embodiments, the carbon-containing layer may be formed in the drift region a trench gate FET. Alternatively, the carbon containing layer may abut sidewalls of trenches extending into the drift region. In some embodiments, the carbon-containing layer has a graded profile to allow for smooth transition from adjacent silicon regions. The above features may be in one or more of the embodiments described herein and their obvious variants. One of ordinary skill in the art would recognize many variations, modifications, and alternatives in view of this disclosure.

Figure 1A:
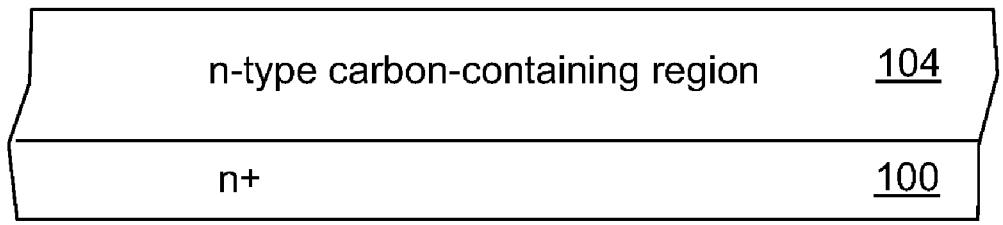
FIGS. 1A-1C are simplified cross-sectional views showing an exemplary method for forming a shielded gate trench power MOSFET in accordance with an embodiment of the present invention.
Figure 1B:
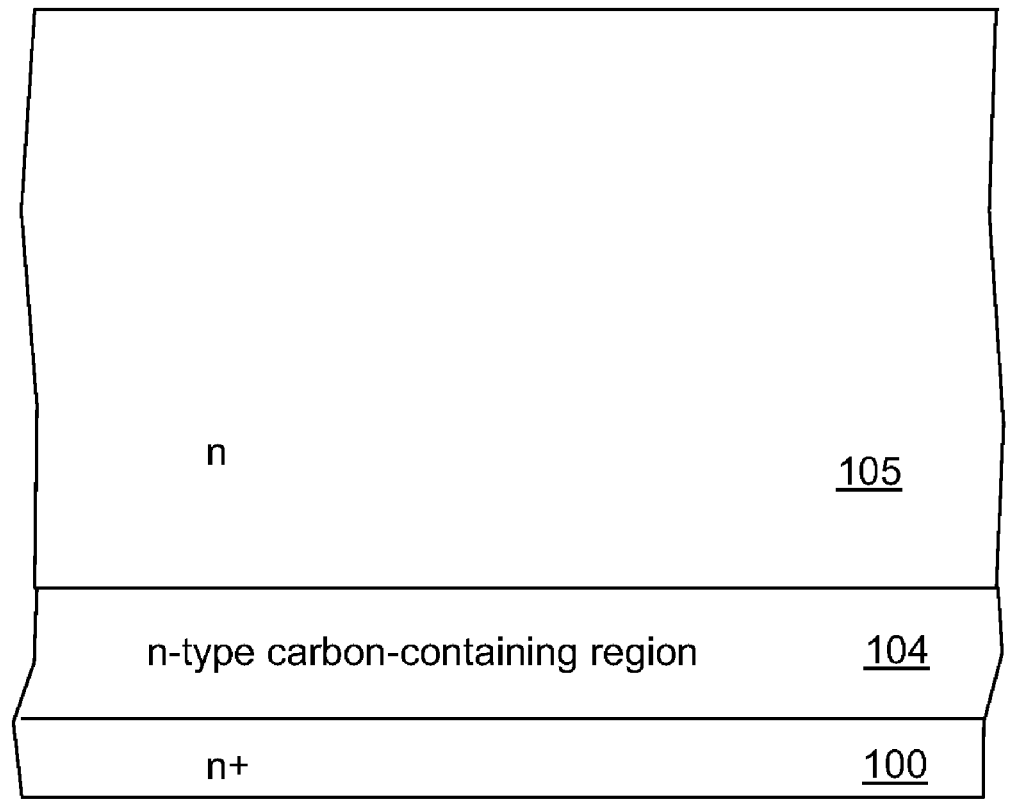
Figures 1C, 1D:
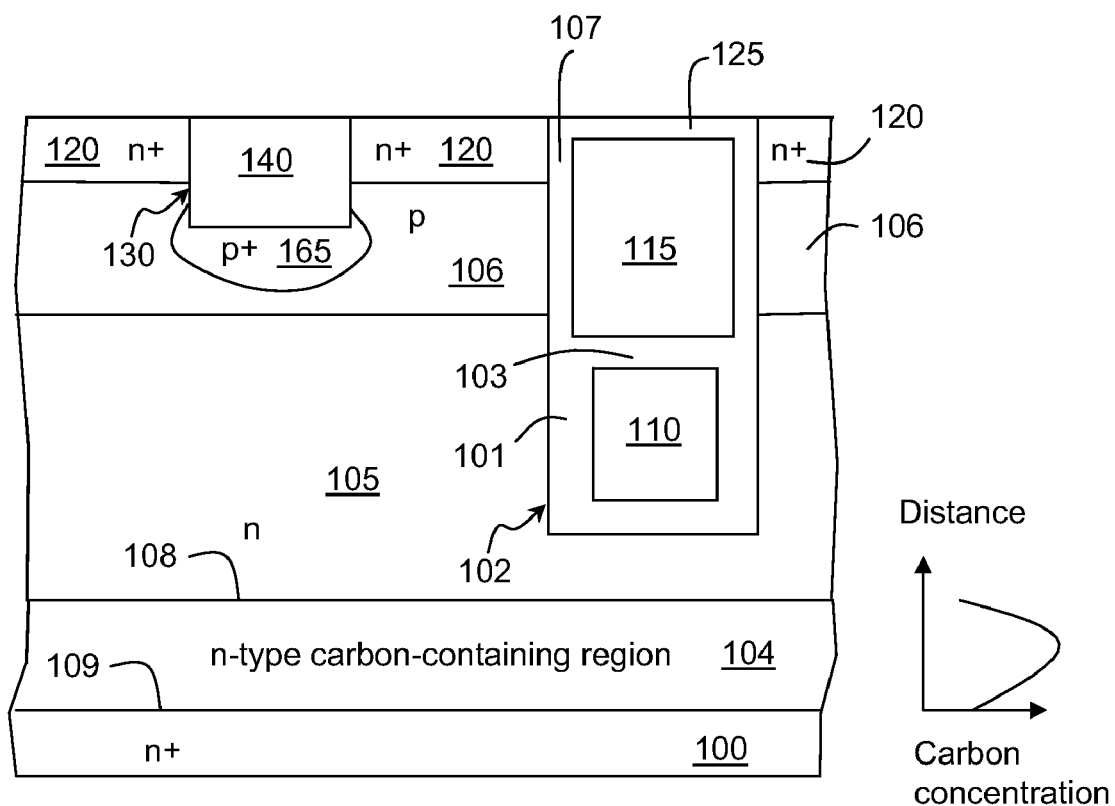
FIG. 1D is a schematic figure showing an exemplary carbon concentration profile within a carbon-containing layer in accordance with an embodiment of the present invention.

FIGS. 1A-1C are simplified cross-sectional views showing an exemplary method for forming a shielded gate trench power MOSFET in accordance with an embodiment of the present invention. In FIG. 1A, a carbon-containing layer 104 is formed over a substrate 100. Substrate 100 can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. The embodiment shown is an n-channel MOSFET, and substrate 100 may include n-type dopants such as phosphorus, arsenic and/or other group V elements.

In some embodiments, carbon-containing layer 104 may be a carbon-containing silicon epitaxial layer, a containing-carbon silicon-germanium epitaxial layer, or various combinations thereof. In some embodiments, carbon-containing layer 104 may be formed by an epitaxial process. The epitaxial process may use a silicon-containing precursor such as silane ($SiH_4$) and a carbon-containing precursor such as alkane (e.g., propane) to form carbon-containing layer 104. In some embodiments, the carbon-containing precursor may have a flow rate between about 1 standard cubic centimeter per minute (sccm) and about 1,000 sccm. In some embodiments, carbon containing layer 104 may have a carbon concentration between about $1\times10^{18}$ and about $1\times10^{21}$. For the n-channel MOSFET embodiment shown, carbon-containing layer 104 may include n-type dopants such as phosphorus, arsenic and/or other group V dopants. In some embodiments, carbon-containing layer 104 may have a thickness between about 500 Å and about 5 µm. In other embodiments, carbon-containing layer 104 may have a thickness of about 1 µm.

In FIG. 1B, n-type epitaxial layer 105 is formed over carbon-containing layer 104. In some embodiments, epitaxial layer 105 may be a silicon epitaxial layer, a silicon-germanium epitaxial layer, or a combination thereof. Epitaxial layer 105 may have n-type dopants such as phosphorus, arsenic and/or other group V dopant.

In some embodiments, carbon-containing layer 104 and epitaxial layer 105 are formed by different processes. In other embodiments, carbon-containing layer 104 and epitaxial layer 105 are formed in a single process. For example, during the formation of carbon-containing layer 104, the carbon-containing precursor, e.g., propane, is added within the processing chamber for interacting with the silicon precursor. After the formation of carbon-containing layer 104, the flow of the carbon-containing precursor is reduced and/or turned off, such that epitaxial layer 105 with little or no carbon therein is formed over carbon-containing layer 104.

In FIG. 1C, p-type body region 106 may be formed in or over epitaxial layer 105. In some embodiments, body region 106 may be formed by implanting dopants in epitaxial layer 105. In other embodiments, body region 106 may be formed by an epitaxial process over epitaxial layer 105. Trenches 102 extending through body region 106 and terminating within a region of epitaxial layer 105 bounded by body region 106 and substrate 100 is formed using conventional techniques. The region of epitaxial layer 105 bounded by body region 106 and substrate 100 is commonly referred to as the drift region. Shield dielectric layer 101 lining the bottom and the lower sidewalls of trenches 102 is formed using known processes.

Shield electrode 110 (e.g., comprising doped or undoped polysilicon) is formed in a bottom portion of each trenches 102 using conventional techniques. Inter-electrode dielectric 103 (e.g., comprising oxide) extending over shield electrode 110 is formed in each trench using conventional techniques. Gate dielectric layer 107 lining upper trench sidewalls is formed using know techniques. In some embodiments, gate dielectric layer 107 is thinner than shield dielectric layer 101. Gate electrode 115 is formed in an upper portion of each trench 102 using conventional methods. N-type source regions 120 are formed in body regions 106 adjacent the trenches, using known techniques.

Gate dielectric 107 may comprise, for example, oxide, nitride, oxynitride, dielectric material, high-k dielectric material or various combinations thereof. In some embodiments, the high-k dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. Gate dielectric 107 may be formed by, for example, a chemical vapor deposition (CVD) process, a physical vapor deposition (PVD) process or other known processes. Gate electrodes 115 may comprise, for example, polysilicon; amorphous silicon; metal-containing material such as Ru, Ti, Ta, W, Hf, metal nitride stacked gates; metal oxide gates such as $RuO_2$ or $IrO_2$; metal nitride gates such as MoN, WN, TiN, TaN, TaAlN; poly SiGe; gate silicide such as $CoSi_2$ or NiSi; or various combinations thereof Gate electrodes 115 may be formed by, for example, a CVD process, a PVD process, an electrochemical plating process, an electroless plating process or other known techniques.

In FIG. 1C, a dielectric layer 125 overlies gate electrodes 115. Dielectric layer 125 may comprise, for example, oxide, nitride, oxynitride, other dielectric material or various combinations thereof. In some embodiments, dielectric layer 125 may be a boron-phosphorus-silicate-glass (BPSG) layer which can be formed by, for example, a CVD process. While dielectric layer 125 is shown as having a flat top surface, in some embodiments, dielectric layer 125 has a dome shape and extends out of trench 102 and overlaps source regions 120.

Contact openings 130 are formed in a center portion of body region 106 between adjacent trenches. In some embodiments, contact openings 130 are formed using a patterned mask layer having a pattern corresponding to openings 130. The patterned mask may be, for example, a patterned photo-resist layer or a patterned dielectric layer. P+ heavy body region 165 is formed in body region 106 along the bottom of each contact opening 130. Heavy body region 165 may be formed using conventional techniques such as implanting dopants in body region 106 through contact openings 130.

A top-side source interconnect layer 140 (not completely shown) is formed over the structure, substantially filling contact opening 130. The Source interconnect layer 140 makes direct contact with heavy body region 165 along the bottom of contact opening 130, and with source regions 120 at least along sidewalls of contact opening 130. The source interconnect layer 140 may comprise, for example, copper, tungsten, aluminum, aluminum copper, titanium, tantalum, cobalt, nickel, platinum, polysilicon, or various combinations thereof. The source interconnect layer 140 may be formed by a CVD process, a PVD process, an electrochemical planting process and/or an electroless plating process. A backside drain interconnect layer (not shown) may be formed on the backside of substrate 100. The drain interconnect layer may comprise similar material as the top-side source interconnect layer 140, and can be formed in a similar manner to the top-side source interconnect layer 140.

While the FIGS. 1A-1C show only one trench 102 and the structure appears asymmetric, it is to be understood that the design to which the cross section views shown and described herein correspond is a cell-based design where one cell is repeated many times to form the complete device.

In FIG. 1C, carbon-containing layer 104 may be directly under or within epitaxial layer 105. In some embodiments, a bottom surface 109 of carbon-containing layer 104 may be spaced from substrate 100. In other embodiments, bottom surface 109 may directly contact substrate 100. As shown in FIG. 1C, top surface 108 of carbon-containing layer 104 extends under trench 102.

FIG. 1D is a graph showing an exemplary carbon concentration profile within carbon-containing layer 104 in accordance with an embodiment of the present invention. In some embodiments, the carbon distribution within carbon-containing layer 104 may have a Gaussian distribution profile. In some embodiments, the carbon concentration near top surface 108 of carbon-containing layer 104 is about $1\times10^{18}$. In other embodiments, the carbon concentration near bottom surface 109 of carbon-containing layer 104 is also about $1\times10^{18}$. In still other embodiments, the carbon concentration at the peak of the Gaussian distribution profile of carbon-containing layer 104 is about $1\times10^{21}$. In yet other embodiments, carbon-containing layer 104 has a graded carbon distribution profile to allow for smooth transition from adjacent silicon regions. For example, the carbon concentration of carbon-containing layer 104 is gradually increased from bottom surface 109 and top surface 108 of carbon-containing layer 104 to reach a peak concentration in a center region of layer 104.

Carbon-containing layer 104 advantageously has increased energy band gap such that the avalanche breakdown voltage is desirably increased. Also, carbon-containing layer 104 desirably increases the thermal conductivity of the power MOSFET. Accordingly, heat generated during operation of the power MOSFET may be dissipated through carbon-containing layer 104 more rapidly.

Figure 2:
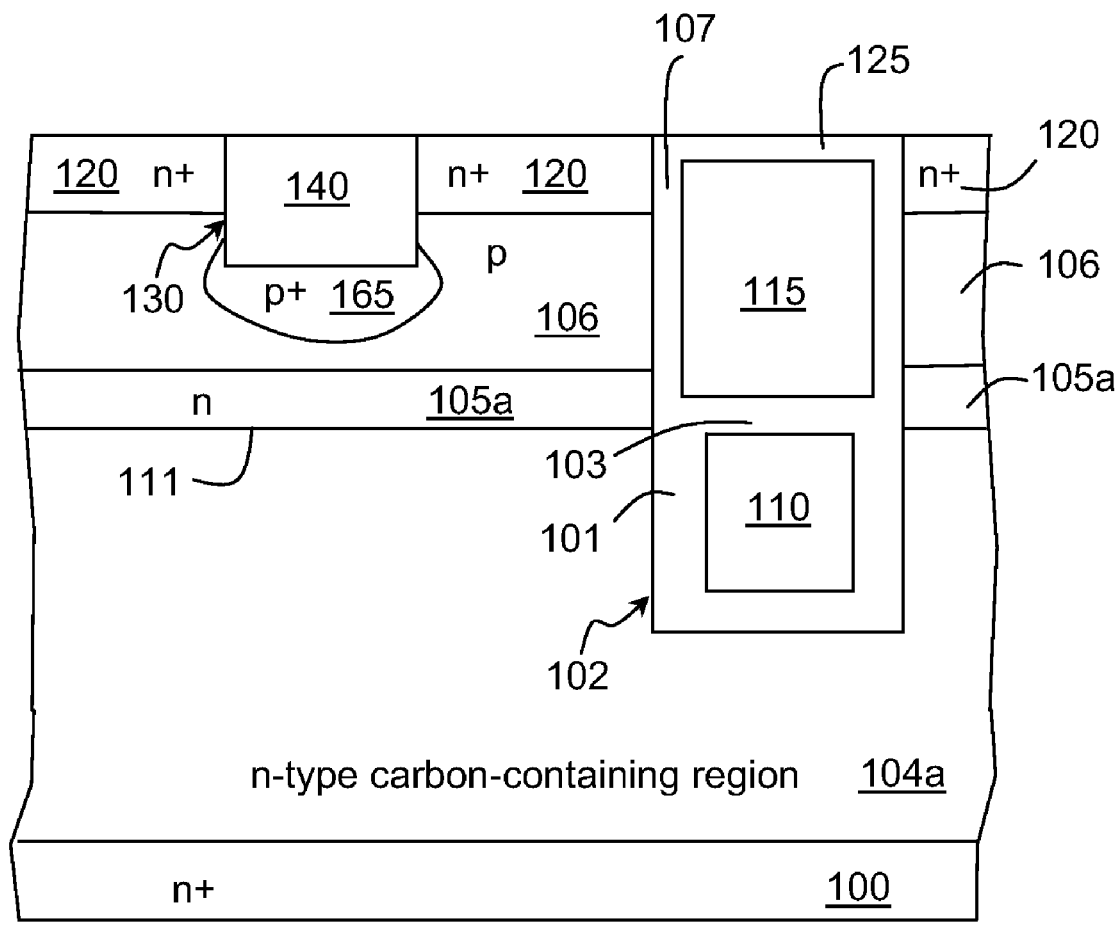
FIG. 2 is a simplified cross-sectional view showing an exemplary shielded gate trench power MOSFET in accordance with another embodiment of the present invention.

While carbon-containing layer 104 is shown extending below trench 102, it can be formed to extend higher up and abut sidewalls of trench 102. FIG. 2 shows such structure. The structure in FIG. 2 is substantially similar to that in FIG. 1C except that carbon-containing layer 104a is formed to extend up along the sidewalls of trench 102. As shown, top surface 111 of carbon-containing layer 104a is adjacent to but is separated from body region 106 by n-type drift region 105a. Materials and methods for forming carbon-containing layer 104a are similar to those of carbon-containing layer 104 described above in reference to FIG. 1C, except that carbon-containing layer 104a is thicker than carbon-containing layer 104.

Figure 3:
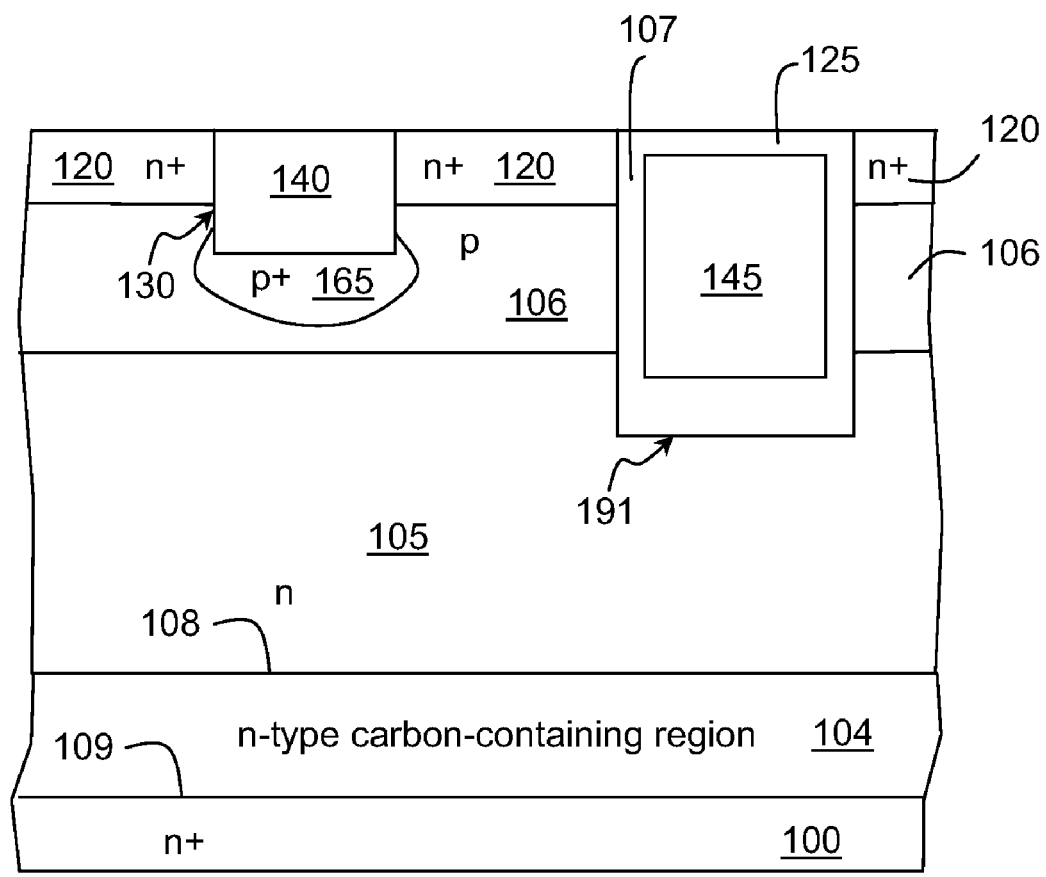
FIG. 3 is a simplified cross-sectional view showing an exemplary trench gate power MOSFET in accordance with an embodiment of the present invention.

FIG. 3 is a simplified cross-sectional view of an exemplary trench gate MOSFET according to another embodiment of the present invention. This embodiment is substantially similar to the embodiment in FIG. 1C except that no shield electrode is formed under gate electrode 145. Instead a dielectric layer which in some embodiments is thicker than gate dielectric 107 (i.e., what is commonly knows as thick bottom dielectric TBO) extends under gate electrode 145 along the trench bottoms.

Figure 4:
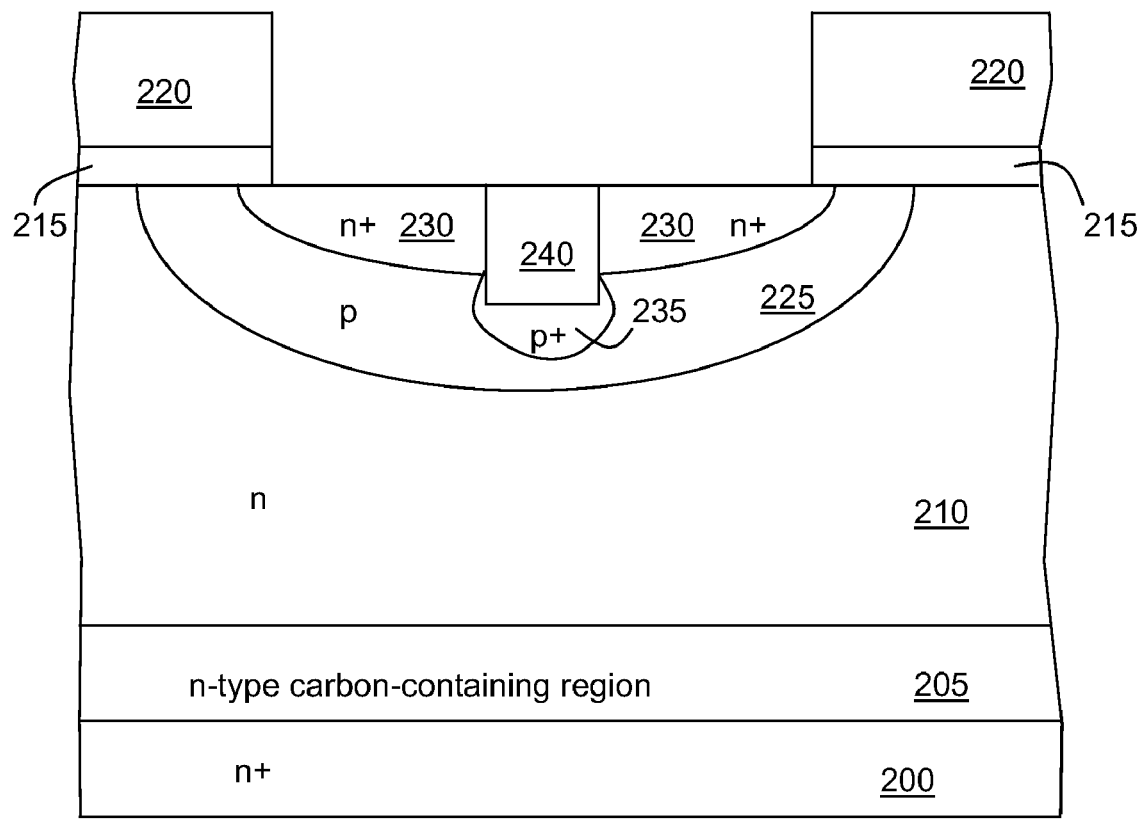
FIG. 4 is a simplified cross-sectional view of an exemplary planar gate MOSFET in accordance with an embodiment of the present invention.

FIG. 4 is a simplified cross-sectional view of an exemplary planar MOSFET in accordance with yet another embodiment of the invention. The structure in FIG. 4 is the planar gate variation of the trench gate MOSFET shown in FIG. 3, and thus many of the same process and structural variations described above in connection with the carbon-containing layer of the various embodiments also apply to the structure in FIG. 4.

In FIG. 4, carbon-containing layer 205 extends over substrate 200. In some embodiments, the materials and methods for forming carbon-containing layer 205 and substrate 200 are similar to carbon-containing layer 104 and substrate 100 in FIG. 1C. N-type epitaxial layer 210 is formed over carbon-containing layer 205. In some embodiments, carbon-containing layer 205 is formed within epitaxial layer 210. Materials and methods for forming epitaxial layer 210 may be similar to epitaxial layer 105 in FIG. 1C.

The stacks of gate dielectric layer 215 and gate electrode 220 are formed over epitaxial layer 210 using known techniques. Body regions 225 are formed in epitaxial layer 210 using conventional techniques. Source regions 230 are formed in body regions 225 using conventional techniques. Heavy body contact openings are forming in body region 225 and later filled with contact material 240. Contact material 240 may form part of a top-side source interconnect layer (not shown) that extends over the structure but is insulated from gate electrodes 220.

Figure 5A:
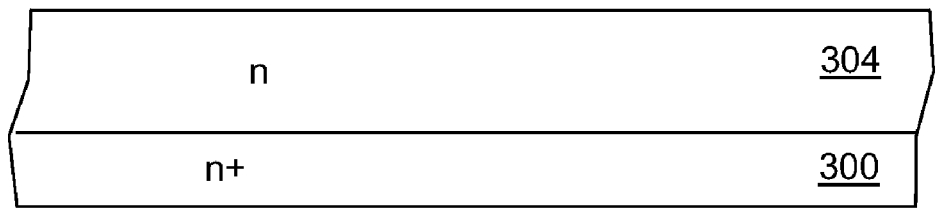
FIGS. 5A-5D are simplified cross-sectional views showing an exemplary method for forming a shielded gate trench power MOSFET in accordance with yet another embodiment of the present invention.

FIGS. 5A-5D are simplified cross-sectional views showing an exemplary method for forming a shielded gate trench power MOSFET in accordance with another embodiment of the present invention. In FIG. 5A, epitaxial layer 304 may be formed over substrate 300. Materials and methods for forming substrate 300 may be similar to substrate 100 in FIG. 1A. Epitaxial layer 304 may be a doped or an undoped silicon epitaxial layer or silicon-germanium epitaxial layer. In some embodiments for forming an n-type MOSFET, epitaxial layer 304 may have dopants of phosphorus, arsenic or other group V dopant.

Figure 5B:
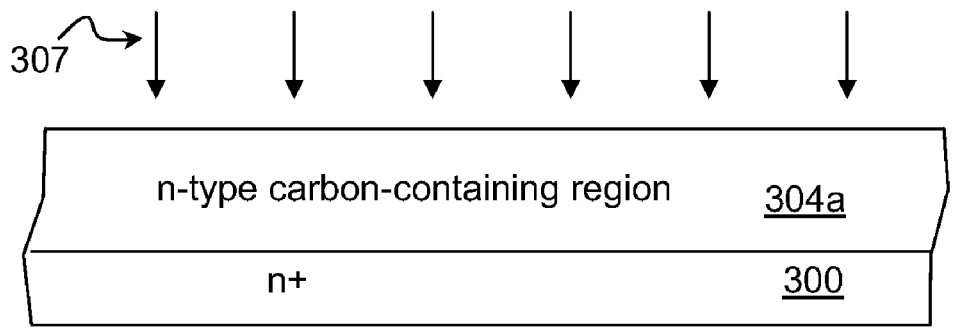

In FIG. 5B, a carbon implantation process 307 may be carried out to implant carbon into epitaxial layer 304 to form carbon-containing layer 304a. Carbon implantation process 307 can be designed to form carbon-containing layer 304a having a dopant profile similar to that of carbon-containing layer 104 in FIGS. 1A-1D.

Figure 5C:
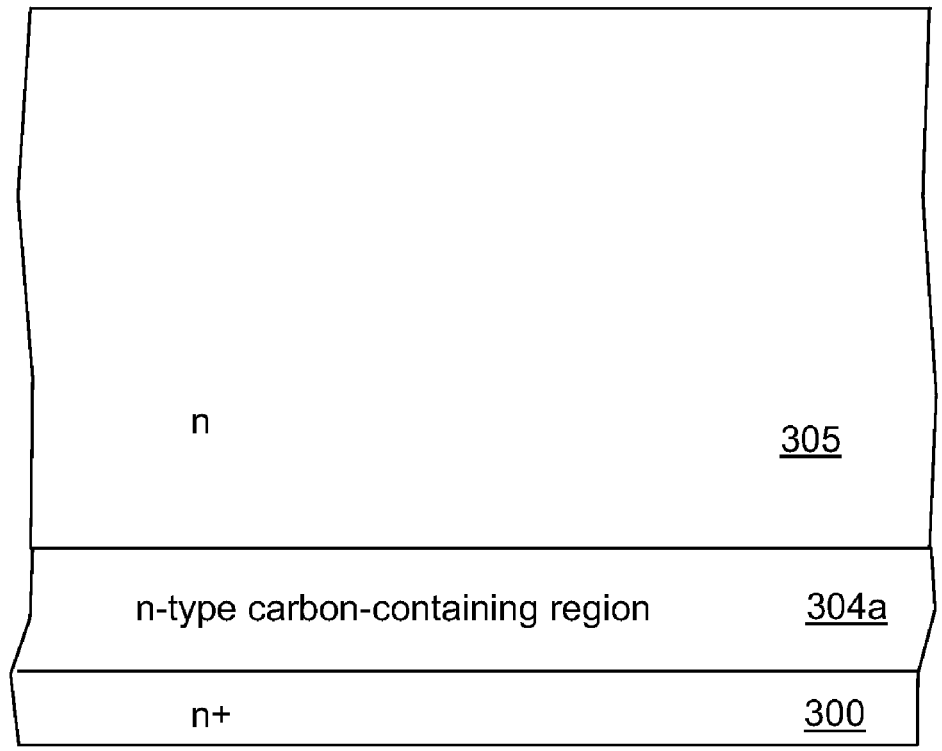
Figure 5D:
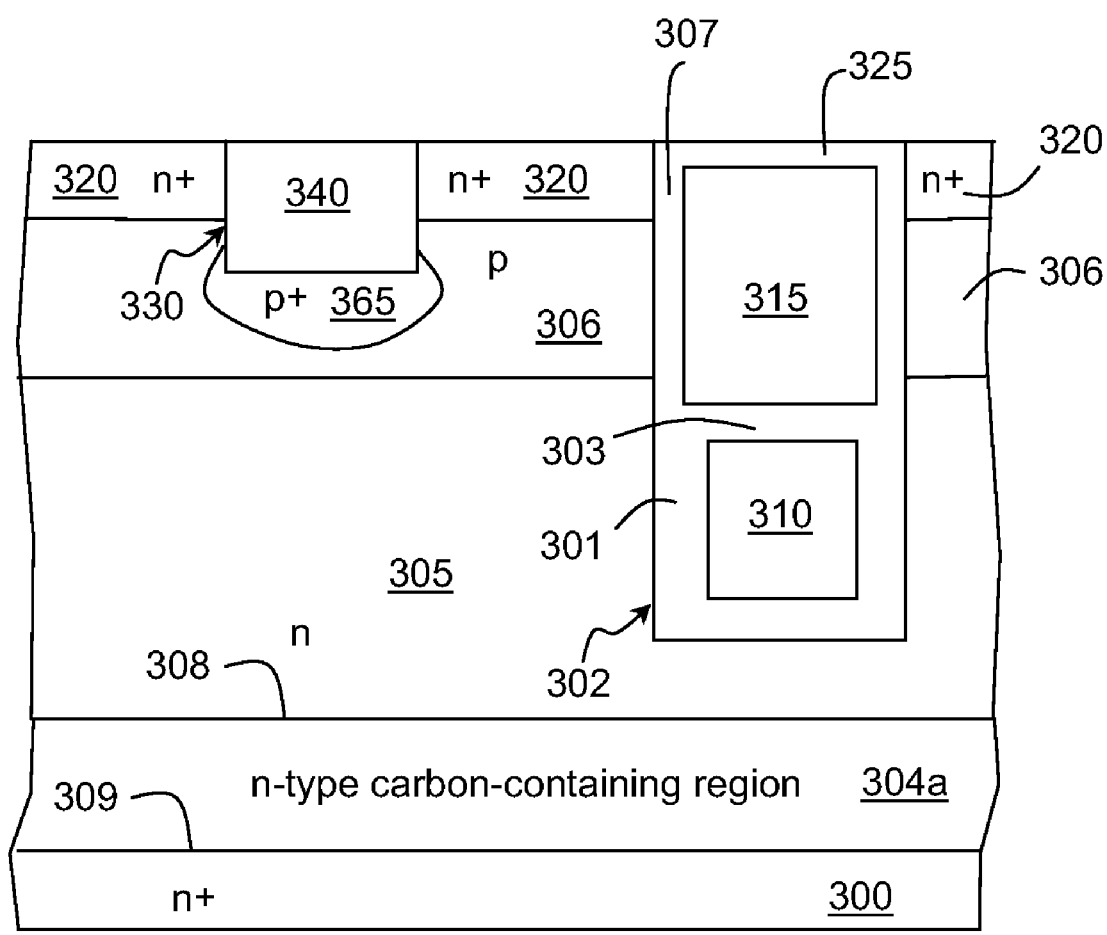

In FIG. 5C, epitaxial layer 305 is formed over carbon-containing layer 304a. In some embodiments, materials and methods for forming the epitaxial layer 305 may be similar to epitaxial layer 105 in FIG. 1B. In FIG. 5D, the trench structure and the materials therein as well as body region 306, source regions 320, heavy body region 365 and contact opening 330 are all substantially similar to those in FIG. 1C and similar techniques to those described above may be used to form these regions and structures.

While in the various embodiments shown and described herein only one carbon-containing region is used, multiple such regions may be employed in the structures. Also, the techniques in accordance with the invention describe herein are not limited to any particular types of transistors and may be implemented in a variety of devices where incorporating a carbon-containing layer in the device is desired. For example, the process sequence depicted in FIGS. 1A-1C can be modified by those skilled in the art to form: p-channel shielded gate trench gate MOSFETs (i.e., a transistor similar in structure to that in FIG. 1C except that the conductivity type of all silicon regions is reversed); n-channel shielded gate trench IGBT (i.e., a transistor similar in structure to that in FIG. 1C except that a p-type substrate is used instead of the n-type substrate); p-channel shielded gate IGBT (i.e., a transistor similar in structure to that in FIG. 1C but with silicon regions of opposite conductivity except the substrate is kept n-type); p-channel variation of the trench gate MOSFET in FIG. 3; p-channel and n-channel IGBT variations of the trench gate MOSFET in FIG. 4; p-channel and n-channel IGBT variations of the planar gate MOSFET in FIG. 4; planar gate and trench gate synchronous FETs (i.e., integrated trench gate or shielded gate or planar gate MOSFET and Schottky rectifier); trench gate and planar gate variety of laterally conducting MOSFETs (i.e., a transistor where the drain contact is made no the top-side) and suprejunction variations of all the above devices (i.e., devices with columns of alternating conductivity type silicon).

Thus, while the above is a complete description of specific embodiments of the present invention, various modifications, variations, and alternatives may be employed. The scope of this invention should thus not be limited to the embodiments described herein, but is instead defined by the following claims.

What is claimed is:

1. A field effect transistor (FET), comprising:
    body regions of a first conductivity type over a semiconductor region of a second conductivity type, the body regions forming p-n junctions with the semiconductor region;
    source regions of the second conductivity type over the body regions, the source regions forming p-n junctions with the body regions;
    gate electrodes extending adjacent to but being insulated from the body regions by a gate dielectric;
    a carbon-containing region of the second conductivity type extending in the semiconductor region below the body regions, wherein the semiconductor region comprises a substrate of the second conductivity type over which the carbon-containing region extends and a drift region of the second conductivity type extending between the carbon-containing region and the body regions.

2. The FET of claim 1 wherein the substrate has a doping concentration greater than that of the drift region.

3. The FET of claim 2 wherein the carbon-containing region is in direct contact with the substrate and is spaced from the body regions.

4. The FET of claim 1, wherein each gate electrode is disposed in a trench extending adjacent the body regions and terminating within the semiconductor region.

5. The FET of claim 4, wherein each trench further includes a shield electrode disposed below the gate electrode, the gate and shield electrodes being insulated from one another by an inter-electrode dielectric layer.

6. The FET of claim 4 wherein each trench includes a thick bottom dielectric extending along the bottom of the trench below the gate electrode.

7. The FET of claim 4, wherein the entirety of carbon-containing region extends below the trenches.

8. The FET of claim 4, wherein the carbon-containing region abuts sidewalls of the trenches.

9. The FET of claim 1, wherein the gate electrodes extend laterally over the semiconductor and body regions and overlap the source regions.

10. The FET of claim 1 wherein a concentration of carbon in the carbon-containing region has a graded profile.

11. The FET of claim 1 wherein a concentration of carbon in the carbon-containing region is between about $1\times10^{18}$ and $1\times10^{21}$.

12. The FET of claim 1 wherein a concentration of carbon in the carbon-containing region has a Gaussian distribution profile.

13. The FET of claim 1 wherein the carbon-containing region has a peak carbon concentration of about $1\times10^{21}$ and a carbon concentration near a top surface and near a bottom surface of about $1\times10^{18}$.

* * * * *